(12) United States Patent
Li

(10) Patent No.: US 9,157,536 B2
(45) Date of Patent: Oct. 13, 2015

(54) BACKFLOW PREVENTION DEVICE AND FAN ASSEMBLY

(75) Inventor: Ran Li, Samutprakarn (TH)

(73) Assignee: DELTA ELECTRONICS (THAILAND) PUBLIC CO., LTD., Samutprakarn (TH)

( * ) Notice: Subject to any disclaimer, the term of this patent is extended or adjusted under 35 U.S.C. 154(b) by 1015 days.

(21) Appl. No.: 13/071,199

(22) Filed: Mar. 24, 2011

(65) Prior Publication Data

US 2012/0145257 A1 Jun. 14, 2012

(30) Foreign Application Priority Data

Dec. 13, 2010 (TW) .............................. 99143562 A

(51) Int. Cl.
| | |
|---|---|
| F24F 7/00 | (2006.01) |
| F24F 13/06 | (2006.01) |
| F24F 13/08 | (2006.01) |
| F16K 15/03 | (2006.01) |
| F04D 25/14 | (2006.01) |

(52) U.S. Cl.
CPC ............... *F16K 15/035* (2013.01); *F04D 25/14* (2013.01); *Y10T 137/3149* (2015.04)

(58) Field of Classification Search
CPC ....................................................... F04D 25/14
USPC ......................................... 454/184, 259, 353
See application file for complete search history.

(56) References Cited

U.S. PATENT DOCUMENTS

| | | | |
|---|---|---|---|
| 4,967,490 A | 11/1990 | Berger et al. | |
| 5,277,658 A * | 1/1994 | Goettl ............................ 454/259 |
| 6,005,770 A * | 12/1999 | Schmitt ......................... 361/695 |
| 6,042,348 A * | 3/2000 | Aakalu et al. ............... 417/423.5 |
| 6,181,557 B1 * | 1/2001 | Gatti ............................. 361/695 |
| 6,688,965 B1 * | 2/2004 | Crippen et al. ............... 454/184 |
| 6,837,785 B2 * | 1/2005 | Soderlund ..................... 454/184 |
| 6,991,533 B2 * | 1/2006 | Tsai et al. ...................... 454/184 |
| 7,238,104 B1 * | 7/2007 | Greenslade et al. .......... 454/184 |
| 7,535,709 B2 * | 5/2009 | Fan et al. ...................... 361/695 |
| 7,800,902 B2 * | 9/2010 | Della Fiora et al. .......... 361/695 |
| 8,007,228 B2 * | 8/2011 | Wang ............................ 415/146 |
| 8,366,417 B2 * | 2/2013 | Fan et al. .................. 417/423.14 |
| 8,534,988 B2 * | 9/2013 | Zhang et al. .................... 415/26 |
| 2005/0088818 A1 * | 4/2005 | Chou ............................ 361/695 |
| 2009/0215380 A1 * | 8/2009 | Lin ................................ 454/184 |
| 2013/0072103 A1 * | 3/2013 | Hopkins et al. ............... 454/259 |

FOREIGN PATENT DOCUMENTS

| | | |
|---|---|---|
| CN | 101657085 | 2/2010 |
| TW | M355304 | 4/2009 |
| TW | M391269 | 10/2010 |

* cited by examiner

*Primary Examiner* — Steven B McAllister
*Assistant Examiner* — Jonathan Cotov
(74) *Attorney, Agent, or Firm* — Kirton McConkie; Evan R. Witt

(57) ABSTRACT

A backflow prevention device includes at least one backflow prevention unit. The backflow prevention unit includes a frame, a first edge shutter plate, a second edge shutter plate and plural intermediate shutter plates. The frame includes an airflow channel. If the first inner sidewall is disposed over the second inner sidewall, the first edge shutter plate and the plural intermediate shutter plates are configured to open or close the airflow channel, and the slab of the second edge shutter plate is inactive. Whereas, if the second inner sidewall is disposed over the first inner sidewall, the second edge shutter plate and the plural intermediate shutter plates are configured to open or close the airflow channel, and the slab of the first edge shutter plate is inactive.

15 Claims, 8 Drawing Sheets

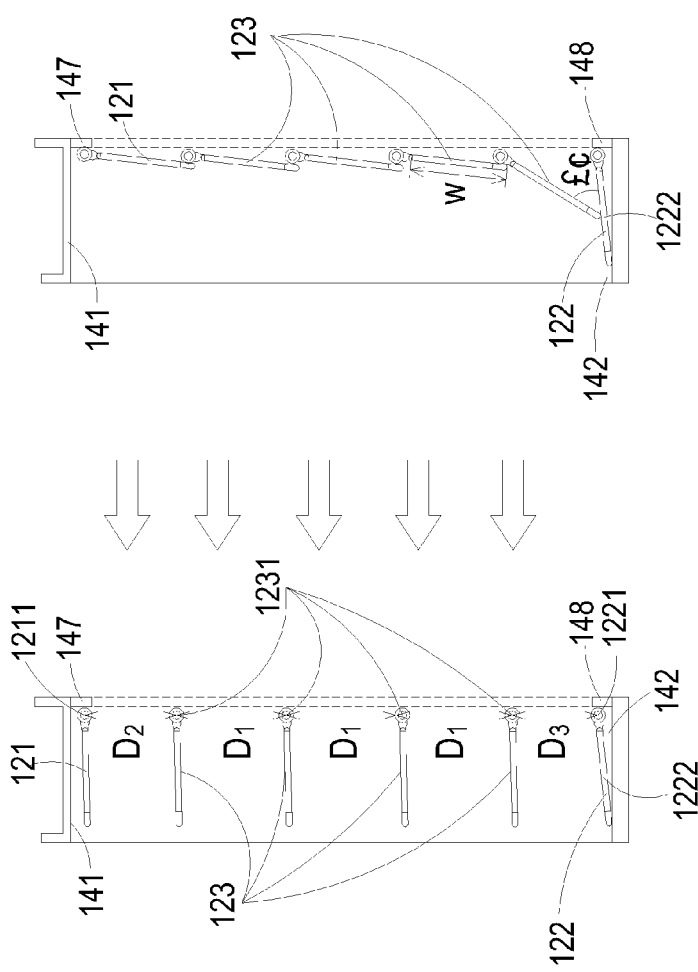

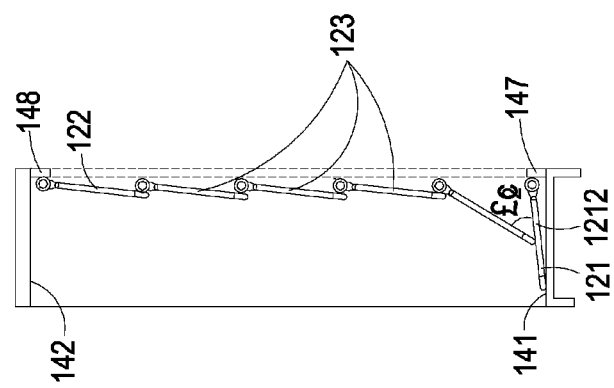
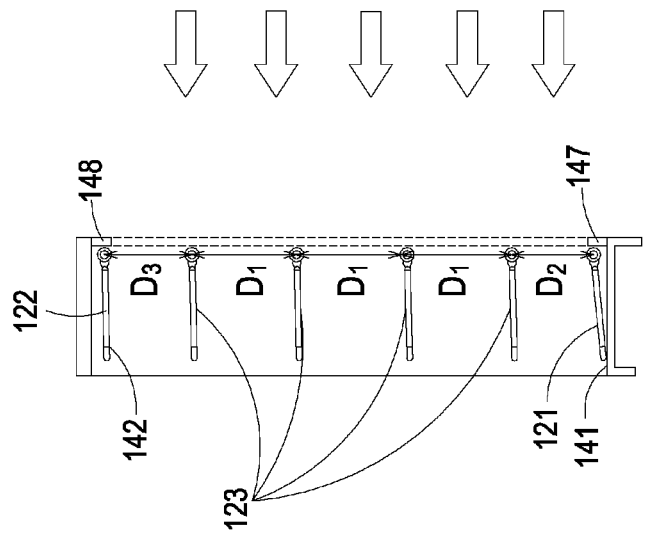
FIG. 4B
FIG. 4A

BACKFLOW PREVENTION DEVICE AND FAN ASSEMBLY

FIELD OF THE INVENTION

The present invention relates to a backflow prevention device, and more particularly to a backflow prevention device for preventing backflow when the backflow prevention device stands upright or upside-down. The present invention also relates to a fan assembly having such a backflow prevention device.

BACKGROUND OF THE INVENTION

With increasing development of science and technology, a variety of power supply apparatuses or electronic devices are developed toward minimization, high integration and high power. As known, the natural convection is insufficient to remove the heat that is generated by the electronic components. If the heat fails to be effectively dissipated away, the elevated operating temperature may result in damage, reduced use life or deteriorated performance of the electronic components. For effectively removing the heat, the power supply apparatus or the electronic device should be equipped with a forced convection mechanism to exhaust the heat to the ambient air.

Conventionally, the forced convection mechanism of the power supply apparatus or the electronic device uses one or more fan units to drive airflow. For example, plural fan units are arranged side by side and accommodated within the casing of the power supply apparatus to drive the airflow in order to exhaust the heat to the ambient air. Generally, the conventional fan assembly comprises plural fan units and plural backflow prevention units corresponding to respective fan units. In a case that a fan unit is normally operated, plural shutter plates of a corresponding backflow prevention unit are rotated to a first position. Meanwhile, the airflow channel of the backflow prevention unit is opened, and the heat is exhausted to the ambient air through the airflow channel. Whereas, in a case that the fan unit is disabled or has a breakdown, the plural shutter plates of the corresponding backflow prevention unit are rotated to a second position. Meanwhile, the airflow channel of the backflow prevention unit is closed to prevent backflow. In such way, the drawbacks resulting from the backflow (e.g. low flow rate of the airflow within the casing, low heat-dissipating efficiency, etc.) will be solved.

Moreover, the conventional backflow prevention units are usually classified into two types, i.e. an active backflow prevention unit and a passive backflow prevention unit. The active backflow prevention unit uses a flow rate detector and a controller to automatically control the open/close statuses of plural shutter plates of the backflow prevention unit. According to the enabling/disabling status of the corresponding fan unit, the airflow channel of the corresponding backflow prevention unit is opened or closed. The passive backflow prevention unit uses gravity forces of the shutter plates (or springs) and the airflow pressure exerted on the shutter plates to control the open/close statuses of the shutter plates of the backflow prevention unit. According to the enabling/disabling status of the corresponding fan unit, the airflow channel of the corresponding backflow prevention unit is opened or closed.

However, since the active backflow prevention unit needs an additional detector and a complicated controlling circuit, the cost and complexity are higher than the passive backflow prevention unit. Moreover, since the passive backflow prevention unit needs plural springs and a position-confining mechanism to open or close the shutter plates, the configurations and cost of the passive backflow prevention unit are still high. Moreover, depending on the system layout, the power supply apparatus or the electronic device may be placed upright or upside down. In a case that the conventional backflow prevention unit is placed upright, the backflow prevention unit is effective to prevent backflow. Whereas, in a case that the conventional backflow prevention unit is placed upside down, the rotations of the shutter plates may be hindered by each other. In addition, since the airflow channel failed to be completely sheltered by the shutter plates when the backflow prevention unit is placed upside down, there is usually an air gap between adjacent shutter plates. Due to the air gap, if the fan unit is disabled or has a breakdown, the airflow channel is not completely closed. Under this circumstance, a short-circulation problem of the airflow occurs, and thus the heat-dissipating efficiency of the overall system is impaired.

SUMMARY OF THE INVENTION

The present invention provides a backflow prevention device capable of preventing backflow when the backflow prevention device stands upright or upside-down, thereby enhancing the flexibility of using the backflow prevention device.

The present invention also provides a backflow prevention device with simplified configurations and cost-effectiveness, in which the rotations of the shutter plates are not hindered by each other and the occurrence of the air gap is minimized or eliminated.

In accordance with an aspect of the present invention, there is provided a backflow prevention device. The backflow prevention device includes at least one backflow prevention unit. The backflow prevention unit includes a frame, a first edge shutter plate, a second edge shutter plate and plural intermediate shutter plates. The frame includes an airflow channel, a first extension wall and a second extension wall. The airflow channel has an inner surface, and the inner surface includes a first inner sidewall and a second inner sidewall. The first inner sidewall and the second inner sidewall are opposed to each other, and the first extension wall and the second extension wall are connected to the side edges of the first inner sidewall and the second inner sidewall, respectively. The first edge shutter plate, the second edge shutter plate and the plural intermediate shutter plates disposed within the airflow channel of the frame. The first edge shutter plate is arranged adjacent to the first inner sidewall, the second edge shutter plate is arranged adjacent to the second inner sidewall, and the plural intermediate shutter plates are arranged between the first edge shutter plate and the second edge shutter plate. Each of the shutter plates has a rotating shaft pivotally coupled to the inner surface and a slab rotatable with respect to the rotating shaft. If the first inner sidewall is disposed over the second inner sidewall, the first edge shutter plate and the plural intermediate shutter plates are configured to open or close the airflow channel, and the second extension wall is configured to prevent the airflow from flowing through the space between the second edge shutter plate and the second inner sidewall. Whereas, if the second inner sidewall is disposed over the first inner sidewall, the second edge shutter plate and the plural intermediate shutter plates are configured to open or close the airflow channel, and the first extension wall is configured to prevent the airflow from flowing through the space between the first edge shutter plate and the first inner sidewall.

In accordance with another aspect of the present invention, there is provided a fan assembly. The fan assembly includes at least one fan unit and a backflow prevention device. The fan unit is used for driving an airflow and includes a fan casing and a blade. The backflow prevention device includes at least one backflow prevention unit. The backflow prevention unit is aligned with a corresponding fan unit. The backflow prevention unit includes a frame, a first edge shutter plate, a second edge shutter plate and plural intermediate shutter plates. The frame includes an airflow channel. The airflow channel has an inner surface, and the inner surface includes a first inner sidewall and a second inner sidewall. The first inner sidewall and the second inner sidewall are opposed to each other. The first edge shutter plate, the second edge shutter plate and the plural intermediate shutter plates are disposed within the airflow channel of the frame. The first edge shutter plate is arranged adjacent to the first inner sidewall, the second edge shutter plate is arranged adjacent to the second inner sidewall, and the plural intermediate shutter plates are arranged between the first edge shutter plate and the second edge shutter plate. Each of the shutter plates has a rotating shaft pivotally coupled to the inner surface and a slab rotatable with respect to the rotating shaft. If the backflow prevention unit is placed in a first orientation, the first edge shutter plate and the plural intermediate shutter plates are configured to open or close the airflow channel, and the slab of the second edge shutter plate is inactive. Whereas, if the backflow prevention unit is placed in a second orientation reverse to the first orientation, the second edge shutter plate and the plural intermediate shutter plates are configured to open or close the airflow channel, and the slab of the first edge shutter plate is inactive.

The above contents of the present invention will become more readily apparent to those ordinarily skilled in the art after reviewing the following detailed description and accompanying drawings, in which:

BRIEF DESCRIPTION OF THE DRAWINGS

FIGS. 3A and 3B are schematic cross-sectional views illustrating the operations of the backflow prevention device of FIG. 2, in which the backflow prevention device is placed in a first orientation;

FIGS. 4A and 4B are schematic cross-sectional views illustrating the operations of the backflow prevention device of FIG. 2, in which the backflow prevention device is placed in a second orientation;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
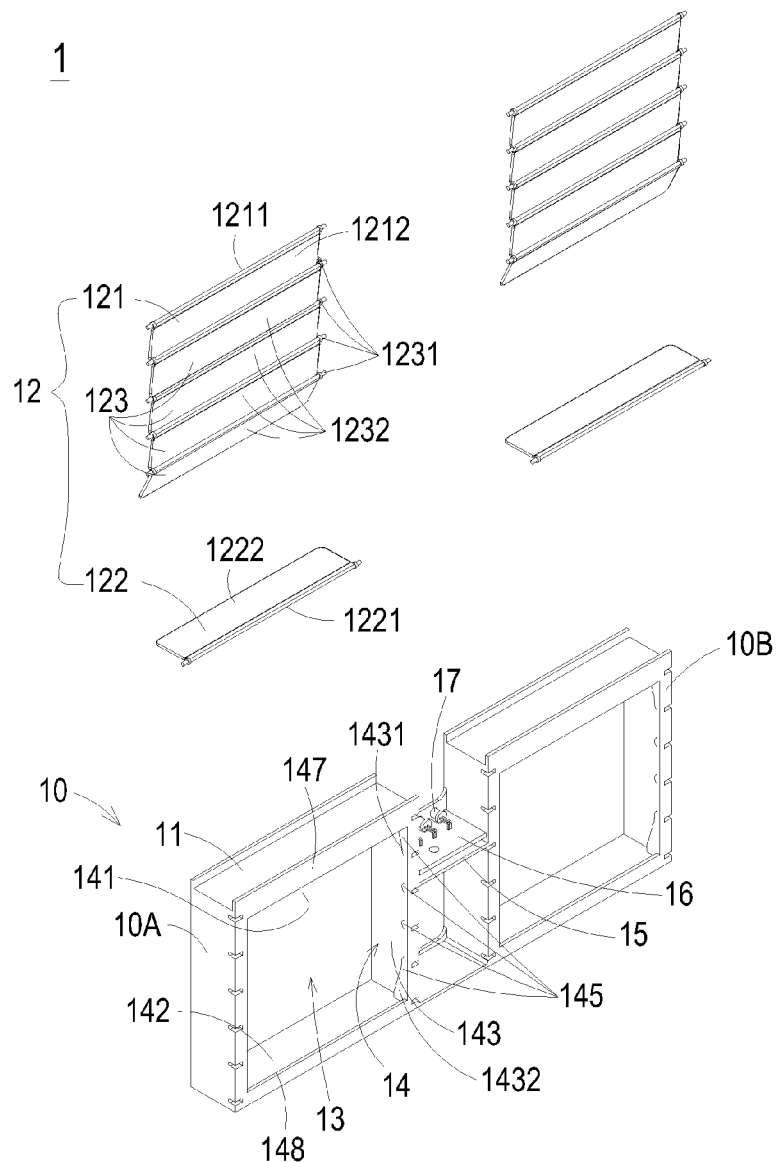
FIGS. 1A and 1B are schematic exploded views illustrating a backflow prevention device according to an embodiment of the present invention and taken along different viewpoints.
Figure 1B:
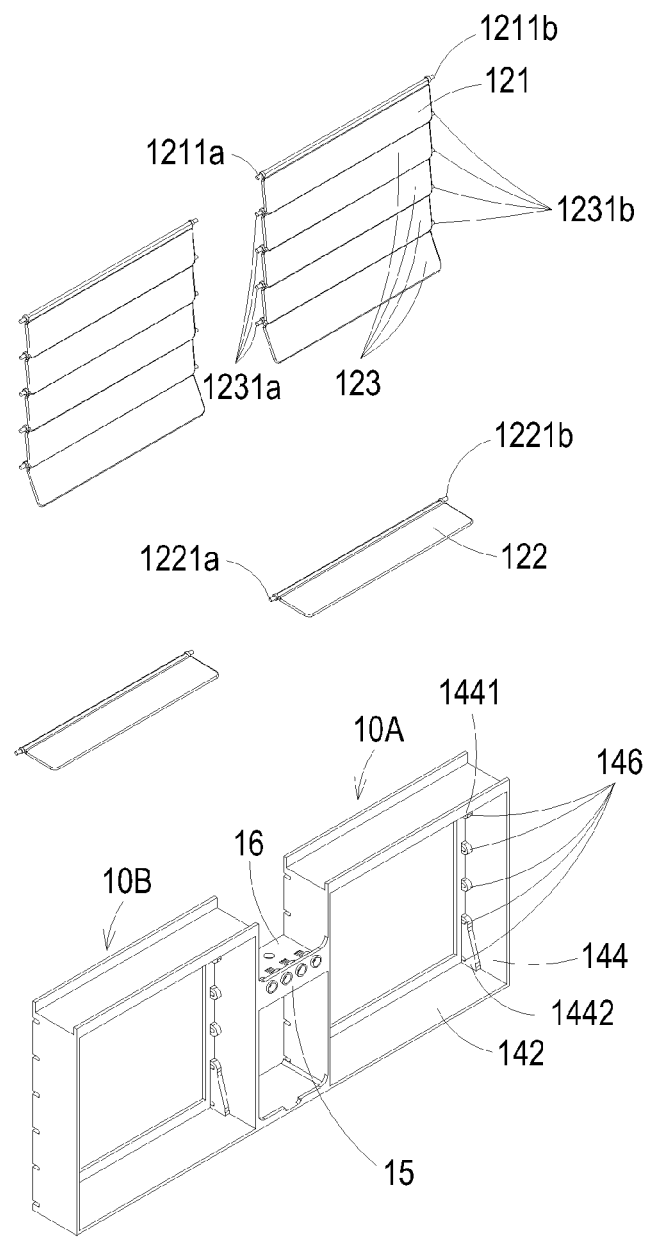
Figure 2A:
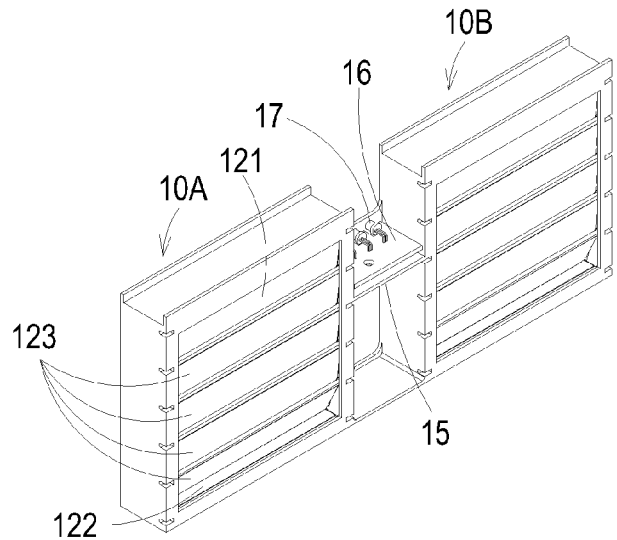
FIGS. 2A and 2B are schematic assembled views illustrating the backflow prevention device of FIGS. 1A and 1B, respectively.
Figure 2B:
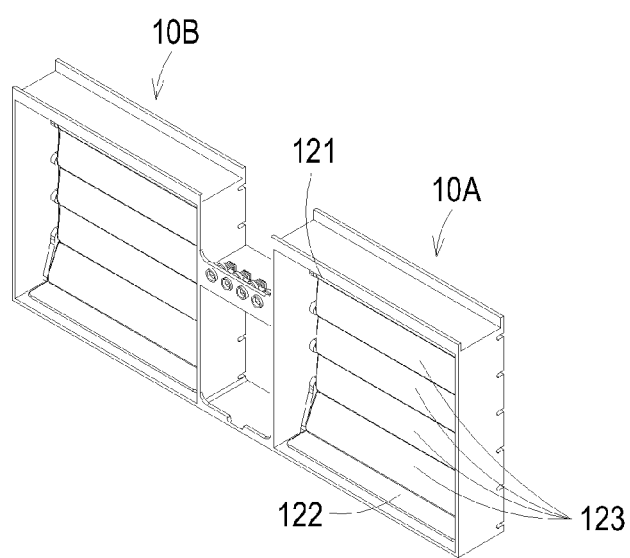

FIGS. 1A and 1B are schematic exploded views illustrating a backflow prevention device according to an embodiment of the present invention and taken along different viewpoints. FIGS. 2A and 2B are schematic assembled views illustrating the backflow prevention device of FIGS. 1A and 1B, respectively. Please refer to FIGS. 1A and 1B and FIGS. 2A and 2B. The backflow prevention device 1 comprises one or more backflow prevention units 10. In this embodiment, the backflow prevention device 1 comprises two backflow prevention units 10, including a first backflow prevention unit 10A and a second backflow prevention unit 10B. Each backflow prevention unit 10 comprises a frame 11 and plural shutter plates 12. The frame 11 has an airflow channel 13. The airflow channel 13 has an inner surface 14. The inner surface 14 comprises a first inner sidewall 141, a second inner sidewall 142, a third inner sidewall 143 and a fourth inner sidewall 144. The first inner sidewall 141 and the second inner sidewall 142 are opposed to each other. The third inner sidewall 143 is arranged adjacent to the first inner sidewall 141 and the second inner sidewall 142. The fourth inner sidewall 144 is arranged adjacent to the first inner sidewall 141 and the second inner sidewall 142. The third inner sidewall 143 and the fourth inner sidewall 144 are opposed to each other. The frame 11 further includes a first extension wall 147 and a second extension wall 148. The first extension wall 147 and the second extension wall 148 are adjacent and connected to the side edges of the first inner sidewall 141 and the second inner sidewall 142, respectively. Preferably, the first extension wall 147 and the second extension wall 148 are vertically connected to the first inner sidewall 141 and the second inner sidewall 142, respectively.

The plural shutter plates 12 comprise a first edge shutter plate 121, a second edge shutter plate 122 and plural intermediate shutter plates 123. These shutter plates 12 are disposed within the airflow channel 13 of the frame 11. The first edge shutter plate 121 is arranged adjacent to the first inner sidewall 141 and the first extension wall 147. The second edge shutter plate 122 is arranged adjacent to the second inner sidewall 142 and the second extension wall 148. The plural intermediate shutter plates 123 are arranged between the first edge shutter plate 121 and the second edge shutter plate 122. The first extension wall 147 is configured to prevent the airflow from flowing through the space between the first edge shutter plate 121 and the first inner sidewall 141, and the second extension wall 148 is configured to prevent the airflow from flowing through the space between the second edge shutter plate 122 and the second inner sidewall 142. The first edge shutter plate 121, the second edge shutter plate 122 and the plural intermediate shutter plates 123 have respective rotating shafts 1211, 1221 and 1231 and respective slabs 1212, 1222 and 1232. The rotating shafts 1211, 1221 and 1231 are pivotally coupled with the inner surface 14. The slabs 1212, 1222 and 1232 are rotatable with respect to the rotating shafts 1211, 1221 and 1231, respectively. In this embodiment, the structures of the first edge shutter plate 121, the second edge shutter plate 122 and the plural intermediate shutter plates 123 are identical.

In some embodiments, the third inner sidewall 143 and the fourth inner sidewall 144 have plural pivotal holes 145 and 146, respectively. The pivotal holes 145 of the third inner sidewall 143 and the pivotal holes 146 of the fourth inner sidewall 144 are respectively aligned with each other. The first ends 1211a, 1221a and 1231a of the rotating shafts 1211, 1221 and 1231 of the shutter plates 121, 122 and 123 are inserted into respective pivotal holes 145 of the third inner sidewall 143. The second ends 1211b, 1221b and 1231b of the rotating shafts 1211, 1221 and 1231 of the shutter plates 121, 122 and 123 are inserted into respective pivotal holes 146 of the fourth inner sidewall 144.

In some embodiments, a first bulge 1431 and a second bulge 1432 are formed on the third inner sidewall 143; and a third bulge 1441 and a fourth bulge 1442 are formed on the fourth inner sidewall 144. The first bulge 1431 and the third bulge 1441 are arranged adjacent to the first inner sidewall 141 for facilitating the intermediate shutter plate 143 next to the first edge shutter plate 121 to stop airflow. The second bulge 1432 and the fourth bulge 1442 are arranged adjacent to the second inner sidewall 142 for facilitating the intermediate shutter plate 143 next to the second edge shutter plate 122 to stop airflow.

FIGS. 3A and 3B are schematic cross-sectional views illustrating the operations of the backflow prevention device of FIG. 2, in which the backflow prevention device is placed in a first orientation. FIGS. 4A and 4B are schematic cross-sectional views illustrating the operations of the backflow prevention device of FIG. 2, in which the backflow prevention device is placed in a second orientation. Please refer to FIGS. 1A and 1B, FIGS. 2A and 2B, FIGS. 3A and 3B and FIGS. 4A and 4B. The rotating shaft 1211 of the first edge shutter plate 121 and the rotating shaft 1221 of the second edge shutter plate 122 are respectively adjacent to both of the first inner sidewall 141 and the first extension wall 147 and both of the second inner sidewall 142 and the second extension wall 148. The distance between the rotating shaft 1211 of the first edge shutter plate 121 and the first inner sidewall 141 is substantially equal to the distance between the rotating shaft 1221 of the second edge shutter plate 122 and the second inner sidewall 142. The distances between the rotating shafts 1211, 1221 and 1231 of every two adjacent shutter plates 121, 122 and 123 is shorter than the widths W of the slabs 1212, 1222, 1232 of respective shutter plates 121, 122 and 123. Consequently, when the airflow channel 113 is closed by the plural shutter plates 12, no air gap is generated.

In this embodiment, the distance D1 between the rotating shafts 1231 of every two adjacent intermediate shutter plates 123 is equal. The distance D2 between the rotating shaft 1211 of the first edge shutter plate 121 and the rotating shaft 1231 of a neighboring intermediate shutter plate 123 is shorter than the distance D1 between the rotating shafts 1231 of every two adjacent intermediate shutter plates 123. In addition, the distance D3 between the rotating shaft 1221 of the second edge shutter plate 122 and the rotating shaft 1231 of a neighboring intermediate shutter plate 123 is shorter than the distance D1 between the rotating shafts 1231 of every two adjacent intermediate shutter plates 123.

In a case that the first inner sidewall 141 of the frame 11 of the backflow prevention unit 10 is disposed over the second inner sidewall 142, the backflow prevention unit 10 is placed in a first orientation (or the backflow prevention unit 10 stands upright). Meanwhile, the first edge shutter plate 121 and the plural intermediate shutter plates 123 are configured to open or close the airflow channel 13. In addition, the slab 1222 of the second edge shutter plate 122 is contacted with the second inner sidewall 142. Under this circumstance, the slab 1222 of the second edge shutter plate 122 is inactive. In response to an airflow pressure, the first edge shutter plate 121 and the plural intermediate shutter plates 123 are rotated in the clockwise direction and thus the airflow channel 13 is opened. The second extension wall 148 is configured to prevent the airflow from flowing through the space between the second edge shutter plate 122 and the second inner sidewall 142 so that the slab 1222 of the second edge shutter plate 122 is inactive (see FIG. 3A). Whereas, in a case that the airflow pressure exerted on the first edge shutter plate 121 and the plural intermediate shutter plates 123 is eliminated, the gravity forces cause the first edge shutter plate 121 and the plural intermediate shutter plates 123 to be rotated in the anti-clockwise direction, and thus the airflow channel 13 is closed (see FIG. 3B). Moreover, since the distance D3 between the rotating shaft 1221 of the second edge shutter plate 122 and the rotating shaft 1231 of a neighboring intermediate shutter plate 123 is shorter than the distance D1 between the rotating shafts 1231, if the airflow pressure exerted on the first edge shutter plate 121 and the plural intermediate shutter plates 123 is eliminated, an first included angle $\theta 1$ is defined between the second edge shutter plate 122 and the neighboring intermediate shutter plate 123. Preferably, the first included angle $\theta 1$ is an acute angle. Due to the first included angle $\theta 1$, if the backflow prevention unit 10 stands upside down, the rotation of the second edge shutter plate 122 will not be hindered by the neighboring intermediate shutter plate 123. Moreover, the second bulge 1432 and the fourth bulge 1442 may facilitating the intermediate shutter plate 143 next to the second edge shutter plate 122 to stop airflow.

Whereas, in a case that the second inner sidewall 142 of the frame 11 of the backflow prevention unit 10 is disposed over the first inner sidewall 142, the backflow prevention unit 10 is placed in a second orientation (or the backflow prevention unit 10 stands upside down). Meanwhile, the second edge shutter plate 122 and the plural intermediate shutter plates 123 are configured to open or close the airflow channel 13. In addition, the slab 1212 of the first edge shutter plate 121 is contacted with the first inner sidewall 141. Under this circumstance, the slab 1212 of the first edge shutter plate 121 is inactive. In response to an airflow pressure, the second edge shutter plate 122 and the plural intermediate shutter plates 123 are rotated in the clockwise direction and thus the airflow channel 13 is opened. The first extension wall 147 is configured to prevent the airflow from flowing through the space between the first edge shutter plate 121 and the first inner sidewall 141 so that the slab 1212 of the first edge shutter plate 121 is inactive (see FIG. 4A). Whereas, in a case that the airflow pressure exerted on the second edge shutter plate 122 and the plural intermediate shutter plates 123 is eliminated, the gravity forces cause the second edge shutter plate 122 and the plural intermediate shutter plates 123 to be rotated in the anti-clockwise direction, and thus the airflow channel 13 is closed (see FIG. 4B). Moreover, since the distance D2 between the rotating shaft 1211 of the first edge shutter plate 121 and the rotating shaft 1231 of a neighboring intermediate shutter plate 123 is shorter than the distance D1 between the rotating shafts 1231, if the airflow pressure exerted on the second edge shutter plate 122 and the plural intermediate shutter plates 123 is eliminated, an second included angle $\theta 2$ is defined between the first edge shutter plate 121 and the neighboring intermediate shutter plate 123. Preferably, the second included angle $\theta 2$ is an acute angle. Due to the second included angle $\theta 2$, if the backflow prevention unit 10 stands upside down, the rotation of the first edge shutter plate 123 will not be hindered by the neighboring intermediate shutter plate 123. Moreover, the first bulge 1431 and the third bulge 1441 may facilitate the intermediate shutter plate 143 next to the first edge shutter plate 122 to stop airflow.

Please refer to FIGS. 1A and 1B and FIGS. 2A and 2B again. In this embodiment, the backflow prevention device 1 comprises a first backflow prevention unit 10A and a second backflow prevention unit 10B. The structures of the first backflow prevention unit 10A and the second backflow prevention unit 10B are identical. The first backflow prevention unit 10A and the second backflow prevention unit 10B are connected with each other. Preferably, the first backflow prevention unit 10A and the second backflow prevention unit 10B are integrally formed. Moreover, the backflow prevention device 1 further comprises a supporting member 15. The supporting member 15 is arranged between the first backflow prevention unit 10A and the second backflow prevention unit 10B for supporting a circuit board 16. It is preferred that plural light-emitting elements 17 are mounted on the circuit board 16.

Figure 5:
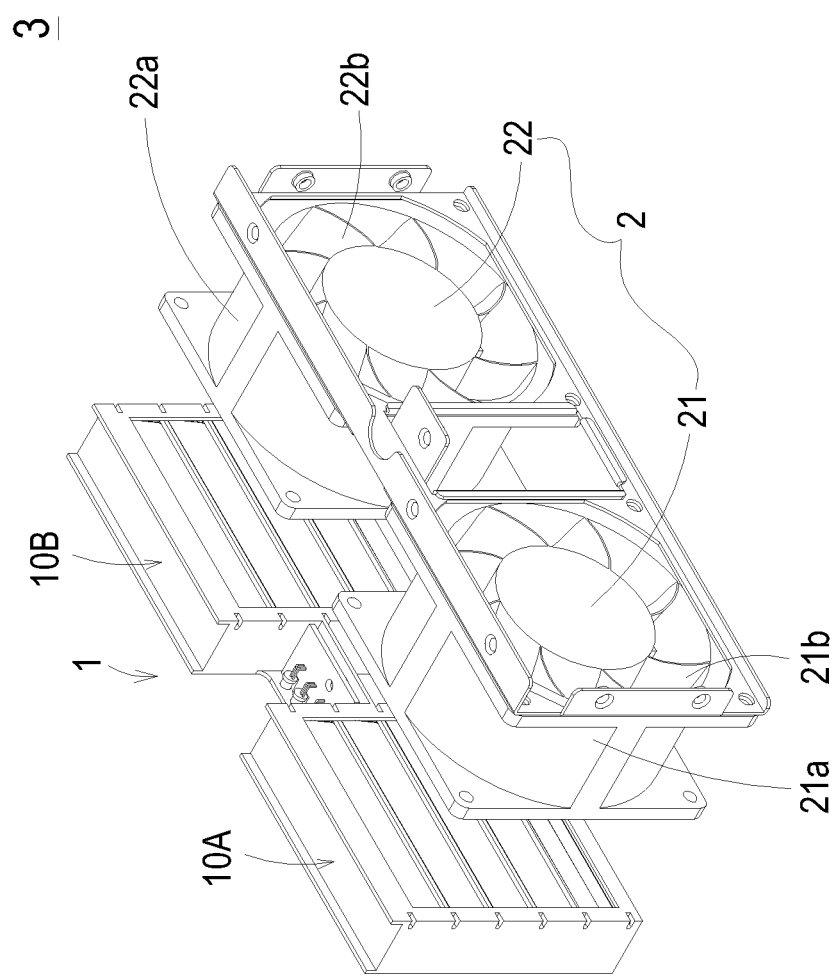
FIG. 5 is a schematic view illustrating a fan assembly with a backflow prevention device according to an embodiment of the present invention.

FIG. 5 is a schematic view illustrating a fan assembly with a backflow prevention device according to an embodiment of the present invention. As shown in FIG. 5, the fan assembly 3 comprises a backflow prevention device 1 and plural fan units 2. The backflow prevention device 1 comprises a first backflow prevention unit 10A and a second backflow prevention unit 10B. The plural fan units 2 comprise a first fan unit 21 and a second fan unit 22. The first fan unit 21 and the second fan unit 22 are configured to drive the airflow. Each of the first fan unit 21 and the second fan unit 22 includes a fan casing 21a, 22a and a blade 21b, 22b. In this embodiment, the first fan unit 21 and the second fan unit 22 are connected with each other and stand side by side. The first backflow prevention unit 10A and the first fan unit 21 are separated and aligned with each other, and the second backflow prevention unit 10B and the second fan unit 22 are separated and aligned with each other. Consequently, the airflow channels of the first backflow prevention unit 10A and the second backflow prevention unit 10B are opened when the first fan unit 21 and the second fan unit 22 are respectively enabled to drive the airflow. Whereas, the airflow channels of the first backflow prevention unit 10A and the second backflow prevention unit 10B are closed when the first fan unit 21 and the second fan unit 22 are respectively disabled. In such way, the short-circulation problem of the airflow will be avoided. In this embodiment, the first fan unit 21 and the second fan unit 22 are axial-flow fans or non-axial-flow fans (e.g. blowers).

Figure 6:
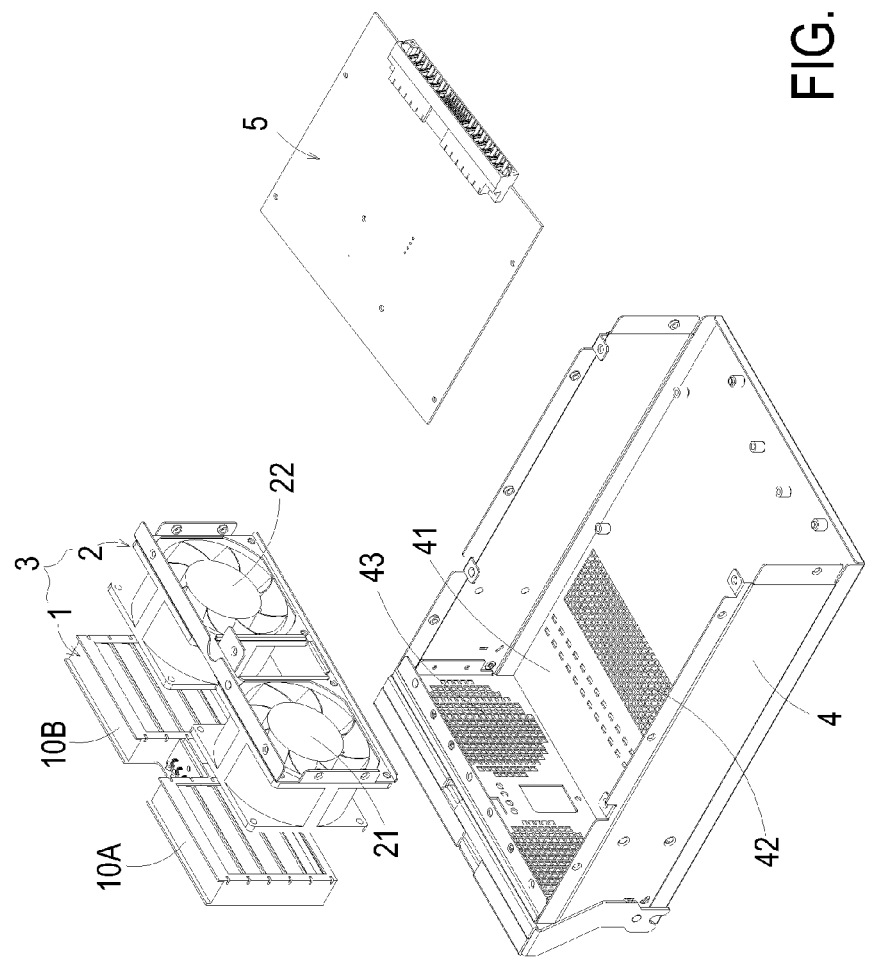
FIG. 6 is a schematic exploded view illustrating a power supply apparatus with a fan assembly according to an embodiment of the present invention.

FIG. 6 is a schematic exploded view illustrating a power supply apparatus with a fan assembly according to an embodiment of the present invention. Please refer to FIGS. 5 and 6. The power supply apparatus 6 comprises a casing 4, a circuit carrier board 5 and a fan assembly 3. The casing 4 has a receptacle 41, an airflow inlet 42 and an airflow outlet 43. The circuit carrier board 5 is accommodated within the receptacle 41 of the casing 4. In this embodiment, a power conversion circuit (not shown) is mounted on the circuit carrier board 5 for converting an input voltage into an output voltage requiring for powering a load. The fan assembly 3 is also accommodated within the receptacle 41 of the casing 4. The airflow channels of the first backflow prevention unit 10A and the second backflow prevention unit 10B are aligned with the airflow outlet 43 of the casing 4.

Please refer to FIGS. 1A and 1B, FIGS. 3A and 3B, FIG. 5 and FIG. 6 again. In a case that the power supply apparatus 6, the fan assembly 3 and the backflow prevention device 1 are placed in the first orientation (i.e. the first inner sidewall 141 is disposed over the second inner sidewall 142) and the first fan unit 21 and the second fan unit 22 are enabled to drive the airflow, the airflow channels 13 are opened in response to the airflow pressure exerted on the first edge shutter plates 121 and the plural intermediate shutter plates 123 of the first backflow prevention unit 10A and the second backflow prevention unit 10B (see FIG. 3A). Consequently, the airflow can be exhausted from the airflow outlet 43 of the casing 4. Under this circumstance, the second edge shutter plates 122 of the first backflow prevention unit 10A and the second backflow prevention unit 10B may be considered as dummy plates due to that the second extension wall 148 can prevent the airflow from flowing through the space between the second edge shutter plate 122 and the second inner sidewall 142. Moreover, the slabs 1222 of the second edge shutter plates 122 are contacted with the second inner sidewalls 142, and the second edge shutter plates 122 are inactive.

Moreover, in a case that the first fan unit 21 is disabled or has a breakdown but the second fan unit 22 is enabled to drive the airflow, the airflow channel 13 of the first backflow prevention unit 10A is closed due to the gravity forces of the first edge shutter plate 121 and the plural intermediate shutter plates 123. Under this circumstance, the second edge shutter plate 122 of the first backflow prevention unit 10A is considered as a dummy plate. The slab 1222 of the second edge shutter plate 122 is contacted with the second inner sidewall 142, and the second edge shutter plates 122 are inactive (see FIG. 3B). Whereas, the airflow channel 13 of the second backflow prevention unit 10B is opened in response to the airflow pressure exerted on the first edge shutter plate 121 and the plural intermediate shutter plate 123. Consequently, the airflow can be exhausted from the airflow outlet 43 of the casing 4. Under this circumstance, the second edge shutter plate 122 of the second backflow prevention unit 10B is also considered as a dummy plate due to that the second extension wall 148 can prevent the airflow from flowing through the space between the second edge shutter plate 122 and the second inner sidewall 142. The slab 1222 of the second edge shutter plate 122 is contacted with the second inner sidewall 142, and the second edge shutter plates 122 are inactive (see FIG. 3A).

Please refer to FIGS. 1A and 1B, FIGS. 4A and 4B, FIG. 5 and FIG. 6 again. In a case that the power supply apparatus 6, the fan assembly 3 and the backflow prevention device 1 are placed in the second orientation reverse to the first orientation (i.e. the second inner sidewall 142 is disposed over the first inner sidewall 141) and the first fan unit 21 and the second fan unit 22 are enabled to drive the airflow, the airflow channels 13 are opened in response to the airflow pressure exerted on the first edge shutter plates 121 and the plural intermediate shutter plates 123 of the first backflow prevention unit 10A and the second backflow prevention unit 10B (see FIG. 4A). Consequently, the airflow can be exhausted from the airflow outlet 43 of the casing 4. Under this circumstance, the first edge shutter plates 121 of the first backflow prevention unit 10A and the second backflow prevention unit 10B may be considered as dummy plates due to that the first extension wall 147 can prevent the airflow from flowing through the space between the first edge shutter plate 121 and the first inner sidewall 141. Moreover, the slabs 1212 of the first edge shutter plates 121 are contacted with the first inner sidewalls 141, and the first edge shutter plates 121 are inactive.

Moreover, in a case that the first fan unit 21 is disabled or has a breakdown but the second fan unit 22 is enabled to drive the airflow, the airflow channel 13 of the first backflow prevention unit 10A is closed due to the gravity forces of the second edge shutter plate 122 and the plural intermediate shutter plates 123. Under this circumstance, the first edge shutter plate 121 of the first backflow prevention unit 10A is considered as a dummy plate. The slab 1212 of the first edge shutter plate 121 is contacted with the first inner sidewall 141, and the first edge shutter plates 121 are inactive (see FIG. 4B). Whereas, the airflow channel 13 of the second backflow prevention unit 10B is opened in response to the airflow pressure exerted on the second edge shutter plate 122 and the plural intermediate shutter plate 123. Consequently, the airflow can be exhausted from the airflow outlet 43 of the casing 4. Under this circumstance, the first edge shutter plate 122 of the second backflow prevention unit 10B is also considered as a dummy plate due to that the first extension wall 147 can prevent the airflow from flowing through the space between the first edge shutter plate 121 and the first inner sidewall 141. The slab 1212 of the first edge shutter plate 121 is contacted with the first inner sidewall 141, and the first edge shutter plates 121 are inactive (see FIG. 4A).

Figure 7:
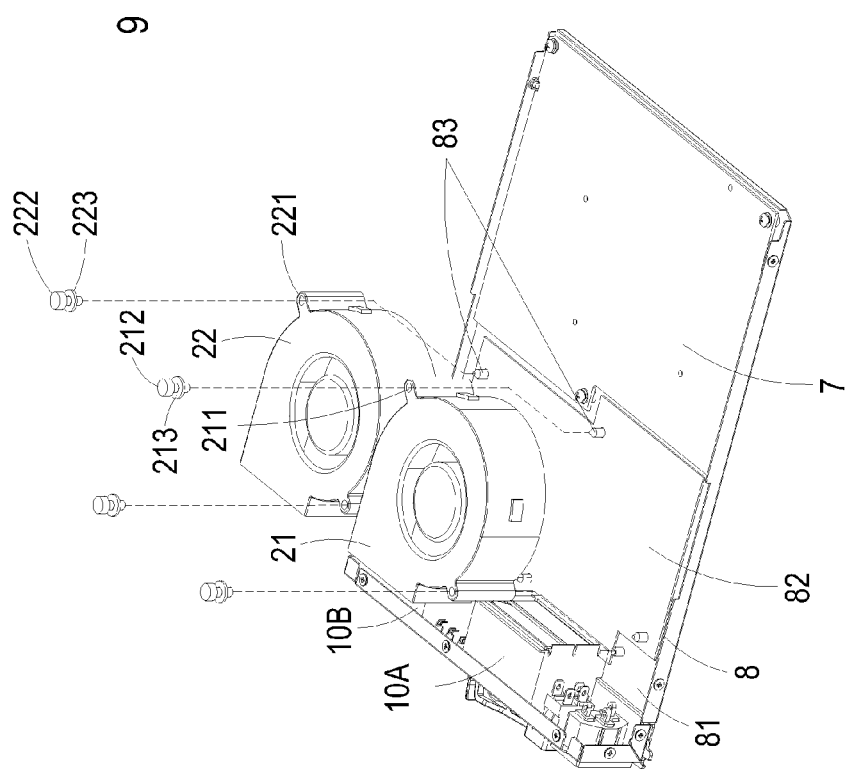
FIG. 7 is a schematic exploded view illustrating a power supply apparatus with a fan assembly according to another embodiment of the present invention.

FIG. 7 is a schematic exploded view illustrating a power supply apparatus with a fan assembly according to another embodiment of the present invention. As shown in FIG. 7, the power supply apparatus 9 comprises a casing 8, a circuit carrier board 7 and a fan assembly 3. The first fan unit 21 and the second fan unit 22 of the fan assembly 3 are non-axial-flow fans (e.g. blowers). The airflow channels of the first backflow prevention unit 10A and the second backflow prevention unit 10B are respectively aligned with the airflow outlets of the first fan unit 21 and the second fan unit 22. For reducing the vibration during operations of the first fan unit 21 and the second fan unit 22, a vibration-absorbing element 82 is arranged between an inner surface 81 of the casing 8 and the first fan unit 21 and the second fan unit 22 of the fan assembly 3. The vibration-absorbing element 82 is a sponge pad or a foam pad. In an embodiment, each of the first fan unit 21 and the second fan unit 22 includes plural perforations 211, 221, plural spacer elements 212, 222 and plural washers 213, 223. The spacer element 212, 222 and the washer 213, 223 are combined and partially installed into a corresponding perforation 211, 221. The casing 8 includes plural fixing posts 83 extending from the inner surface 81. The plural fixing post 83 can be installed into a corresponding perforation 211, 221 of the first fan unit 21 and the second fan unit 22 for positioning the first fan unit 21 and the second fan unit 22. Moreover, when an upper casing and a lower casing are assembled to form the casing 8, the spacer elements 212, 222 and the washer 213, 223 can be employed to fill up the gap between the first fan unit 21 and the second fan unit 22 and an inner surface of the upper casing for locking the first fan unit 21 and the second fan unit 22 of the fan assembly 3. Therefore, the first fan unit 21 and the second fan unit 22 are fixed on the casing 8 by means of spacer elements 212, 222, washers 213, 223 and fixing posts 83. For further reducing the vibration of the first fan unit 21 and the second fan unit 22, the spacer elements 212, 222 and the washers 213, 223 are preferably made of elastic materials.

From the above description, the backflow prevention device of the present invention is capable of preventing backflow when the backflow prevention device stands upright or upside-down. As a consequence, the flexibility of using the backflow prevention device and the fan assembly will be enhanced. Moreover, the backflow prevention device and the fan assembly of the present invention have simplified configurations and cost-effectiveness. The backflow prevention device and the fan assembly may be placed in any orientation. Moreover, since the rotations of the shutter plates are not hindered by each other and the occurrence of the air gap is minimized or eliminated, the efficacy of preventing backflow is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A backflow prevention device, comprising:
   at least one backflow prevention unit, said backflow prevention unit comprising:
   a frame comprising an airflow channel, a first extension wall and a second extension wall, wherein said airflow channel has an inner surface, and said inner surface comprises a first inner sidewall and a second inner sidewall, wherein said first inner sidewall and said second inner sidewall are opposed to each other, and said first extension wall and said second extension wall are connected to the side edges of said first inner sidewall and said second inner sidewall, respectively; and
   a first edge shutter plate, a second edge shutter plate and plural intermediate shutter plates disposed within said airflow channel of said frame, wherein said first edge shutter plate is arranged adjacent to said first inner sidewall and said first extension wall, said second edge shutter plate is arranged adjacent to said second inner sidewall and said second extension wall, and said plural intermediate shutter plates are arranged between said first edge shutter plate and said second edge shutter plate, wherein each of said shutter plates has a rotating shaft pivotally coupled to said inner surface and a slab rotatable with respect to an axis of said rotating shaft, the distance between said rotating shafts of said first edge shutter plate and a neighboring intermediate shutter plate is shorter than the distance between said rotating shafts of every two adjacent intermediate shutter plates, and the distance between said rotating shafts of said second edge shutter plate and a neighboring intermediate shutter plate is shorter than the distance between said rotating shafts of every two adjacent intermediate shutter plates,
   when said first inner sidewall is disposed over said second inner sidewall, said first edge shutter plate and said plural intermediate shutter plates are configured to open or close said airflow channel, and said second extension wall is configured to prevent the airflow from flowing through a space between said second edge shutter plate and said second inner sidewall, wherein when said first edge shutter plate and said plural intermediate shutter plates are configured to close said airflow channel, a first acute angle is formed between said second edge shutter plate and said neighboring intermediate shutter plate, wherein said second edge shutter plate contacts said second inner sidewall, when said second inner sidewall is disposed over said first inner sidewall, said second edge shutter plate and said plural intermediate shutter plates are configured to open or close said airflow channel, and said first extension wall is configured to prevent the airflow from flowing through a space between said first edge shutter plate and said first inner sidewall, wherein when said second edge shutter plate and said plural intermediate shutter plates are configured to close said airflow channel, a second acute angle is formed between said first edge shutter plate and said neighboring intermediate shutter plate wherein said first edge shutter plate contacts said first inner sidewall.

2. The backflow prevention device according to claim 1, wherein said inner surface of said frame further comprises a third inner sidewall and a fourth inner sidewall, wherein said third sidewall is arranged adjacent to said first inner sidewall and said second inner sidewall, and said third inner sidewall and said fourth inner sidewall are opposed to each other.

3. The backflow prevention device according to claim 2, wherein said rotating shaft of each shutter plate has a first end and a second end, wherein said first end is pivotally coupled to said third inner sidewall, and said second end is pivotally coupled to said fourth inner sidewall.

4. The backflow prevention device according to claim 2, wherein a first bulge and a second bulge are formed on said third inner sidewall, a third bulge and a fourth bulge are formed on said fourth inner sidewall, wherein said first bulge and said third bulge are arranged adjacent to said first inner sidewall, and said second bulge and said fourth bulge are arranged adjacent to said second inner sidewall.

5. The backflow prevention device according to claim 1, wherein the distance between said rotating shaft of a specified shutter plate and said rotating shaft of an adjacent shutter plate is shorter than a width of said slab of said specified shutter plate.

6. The backflow prevention device according to claim 1, wherein the distance between said rotating shafts of every two adjacent intermediate shutter plates is equal.

7. The backflow prevention device according to claim 1, wherein the structures of said first edge shutter plate, said second edge shutter plate and said intermediate shutter plates are substantially identical.

8. The backflow prevention device according to claim 1, wherein if said first inner sidewall is disposed over said second inner sidewall, said airflow channel is opened in response to an airflow pressure exerted on said first edge shutter plate and said plural intermediate shutter plates, and said airflow channel is closed when said airflow pressure exerted on said first edge shutter plate and said plural intermediate shutter plates is eliminated.

9. The backflow prevention device according to claim 1, wherein if said second inner sidewall is disposed over said first inner sidewall, said airflow channel is opened in response to an airflow pressure exerted on said second edge shutter plate and said plural intermediate shutter plates, and said airflow channel is closed when said airflow pressure exerted on said second edge shutter plate and said plural intermediate shutter plates is eliminated.

10. The backflow prevention device according to claim 1, wherein said backflow prevention device comprises a first backflow prevention unit and a second backflow prevention unit, which have the same structures and are connected with each other.

11. The backflow prevention device according to claim 10, wherein said first backflow prevention unit and said second backflow prevention unit are integrally formed.

12. The backflow prevention device according to claim 10, wherein said backflow prevention device further comprises a supporting member, which is arranged between said first backflow prevention unit and said second backflow prevention unit for supporting and fixing a circuit board.

13. A fan assembly, comprising:
at least one fan unit for driving an airflow and comprising a fan casing and a blade; and
a backflow prevention device comprising at least one backflow prevention unit, wherein said backflow prevention unit is aligned with a corresponding fan unit, and comprises:
a frame comprising an airflow channel, wherein said airflow channel has an inner surface, and said inner surface comprises a first inner sidewall and a second inner sidewall, wherein said first inner sidewall and said second inner sidewall are opposed to each other; and
a first edge shutter plate, a second edge shutter plate and plural intermediate shutter plates disposed within said airflow channel of said frame, wherein said first edge shutter plate is arranged adjacent to said first inner sidewall, said second edge shutter plate is arranged adjacent to said second inner sidewall, and said plural intermediate shutter plates are arranged between said first edge shutter plate and said second edge shutter plate, wherein each of said shutter plates has a rotating shaft pivotally coupled to said inner surface and a slab rotatable with respect to an axis of said rotating shaft, the distance between said rotating shafts of said first edge shutter plate and a neighboring intermediate shutter plate is shorter than the distance between said rotating shafts of every two adjacent intermediate shutter plates, and the distance between said rotating shafts of said second edge shutter plate and a neighboring intermediate shutter plate is shorter than the distance between said rotating shafts of every two adjacent intermediate shutter plates,
when said backflow prevention unit is placed in a first orientation, said first edge shutter plate and said plural intermediate shutter plates are configured to open or close said airflow channel, and said second edge shutter plate is inactive, wherein when said first edge shutter plate and said plural intermediate shutter plates are configured to close said airflow channel, a first acute angle is formed between said second edge shutter plate and said neighboring intermediate shutter plate, wherein said second edge shutter plate contacts said second inner sidewall, when said backflow prevention unit is placed in a second orientation reverse to said first orientation, said second edge shutter plate and said plural intermediate shutter plates are configured to open or close said airflow channel, and said first edge shutter plate is inactive, wherein when said second edge shutter plate and said plural intermediate shutter plates are configured to close said airflow channel, a second acute angle is formed between said first edge shutter plate and said neighboring intermediate shutter plate wherein said first edge shutter plate contacts said first inner sidewall.

14. The fan assembly according to claim 13, wherein said fan unit is an axial-flow fan or a blower.

15. The fan assembly according to claim 13, wherein said fan assembly is installed within a casing of a power supply apparatus, and said power supply apparatus comprises a vibration-absorbing element arranged between said fan assembly and an inner surface of said casing.

* * * * *